US006816180B1

(12) United States Patent
Paz-Pujalt et al.

(10) Patent No.: US 6,816,180 B1
(45) Date of Patent: Nov. 9, 2004

(54) AUTHENTICATED IMAGES ON LABELS

(75) Inventors: Gustavo R. Paz-Pujalt, Rochester, NY (US); David L. Patton, Webster, NY (US); Kevin W. Williams, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/429,347

(22) Filed: May 5, 2003

(51) Int. Cl.[7] .......................... B41J 2/325; B41J 2/435; B42D 15/00; G03F 3/00

(52) U.S. Cl. .................. 347/224; 400/120.04; 347/176

(58) Field of Search ................................ 347/171, 172, 347/174, 176, 224; 400/120.04; 283/72, 74, 75, 77, 81, 82, 92, 93

(56) References Cited

U.S. PATENT DOCUMENTS 5,882,463 A * 3/1999 Tompkin et al. ............ 156/234
6,025,860 A * 2/2000 Rosenfeld et al. .......... 347/171
6,136,752 A 10/2000 Paz-Pujalt et al.

* cited by examiner

*Primary Examiner*—Huan Tran
(74) *Attorney, Agent, or Firm*—Raymond L. Owens

(57) ABSTRACT

A method of forming authenticated secure images on image areas on labels including the steps of storing in memory a number of different selectable label size and shapes; selecting an appropriate label size and shape from the memory for a particular image; moving a colorant donor element having a plurality of transferable colorants into transferable relationship with a receiver, the colorant donor element includes a representation of the particular image and marks which authenticate the particular image having colorant over such representation and marks; transferring colorants onto the receiver in accordance with the representation of the particular image and marks in the colorant donor element and the size of the selected label to form authenticated images in the receiver; and cutting the images on the receiver into the selected shape to form a plurality of labels each having an authenticated image.

10 Claims, 6 Drawing Sheets

AUTHENTICATED IMAGES ON LABELS

FIELD OF THE INVENTION

The present invention relates forming authenticated images on labels.

BACKGROUND OF THE INVENTION

Heretofore images of high quality have been produced by thermal printers. In a typical thermal printer an image is formed in three passes. First a dye donor having color such as yellow is placed in dye transfer relationship with a receiver and then the dye donor is heated in a pattern corresponding to the yellow portion of an image to be completed. Thereafter, cyan and magenta portions of the image are formed in a similar fashion. The completed color image on the receiver is continuous tone and in many cases can rival photographic quality.

In one type of thermal printer, which prints colored images, a donor contains a repeating series of spaced frames of different colored heat transferable dyes. The donor is disposed between a receiver, such as coated paper, and a print head formed of, for example, a plurality of individual heating resistors. When a particular heating resistor is energized, it produces heat and causes dye from the donor to transfer to the receiver. The density or darkness of the printed color dye is a function of the energy delivered from the heating element to the donor.

Thermal dye transfer printers offer the advantage of true "continuous tone" dye density transfer. This result is obtained by varying the energy applied to each heating element, yielding a variable dye density image pixel in the receiver.

Thermally printed images are used in a number of different applications. In one of those applications, so-called "sticker prints" are made on a receiver and arranged so that they can be peeled off and individually pasted onto another surface. However, these stickers are not used in situations, which require that they be "authentic". By use of the term "authenticated" it is meant that the image can indicate to a viewer or a reader with a high degree of certainty that the image has not been counterfeited.

Thermally printed images have an advantage over other forms of printing in that smaller number of unique prints can be made on a cost effective basis. Product safety and brand protection standards dictate that one of the most important areas of protection or authentication is the product label. Commonly assigned U.S. Pat. No. 6,136,752 discloses a thermal printer to make postage stamps which uses a receiver having authenticating marks, the disclosures of which arc incorporated by reference.

Businesses throughout the world lose substantial sums to non-authentic products bearing labels that are counterfeit. With the advent of inexpensive digital printers it is possible to counterfeit labels of premium products thus creating revenue losses to bonafide manufacturers, and potential dangers to the public in terms of low or no performance of the product as in the case of pharmaceuticals for example. In other cases labels are used to indicate that a product or object has undergone and passed or failed certain inspection by is approved or bonded authorities or their agents. In these cases it is very important that labels are authentic.

SUMMARY OF THE INVENTION

It is an object of the present invention to produce an authenticated image, which can be used in applications such as secure product labels of different shapes and sizes.

This object is achieved in a method of forming authenticated secure images on labels comprising the steps of:

(a) storing in memory a number of different selectable label sizes and shapes;

(b) selecting an appropriate label size and shape from the memory for a particular image;

(c) moving a colorant donor clement having a colorant into transferable relationship with a receiver, the colorant donor element includes marks which authenticate a particular image and having colorant over such marks;

(d) transferring colorant onto the receiver in accordance with the representation of the particular image and marks in the colorant donor element and the size and shape of the selected label to form authenticated images in the receiver; and (e) cutting the images on the receiver into the selected shape to form a plurality of labels each having an authenticated image.

The present invention provides secure product labels having different shapes and sizes. Furthermore it neither provides a size and shape adjusting step including sizing the image so that it forms a justified image on a given label size and shape.

An advantage of the present invention is that an image is authenticated by marks transferred to the receiver.

An advantage of the present invention is that images can rarely be produced which are authentic and which prevent counterfeiting, misuse or fraud.

A feature of the present invention is that authenticating marks can be formed on a receiver as part of the printing process. This authenticating information can be in the form of a bar code, an official seal, alphanumeric data or encoded digitized information Another feature of the present invention is that it facilitates the design of images to be authenticated such as secure product labels and documents.

DETAILED DESCRIPTION OF THE INVENTION

Figure 1:
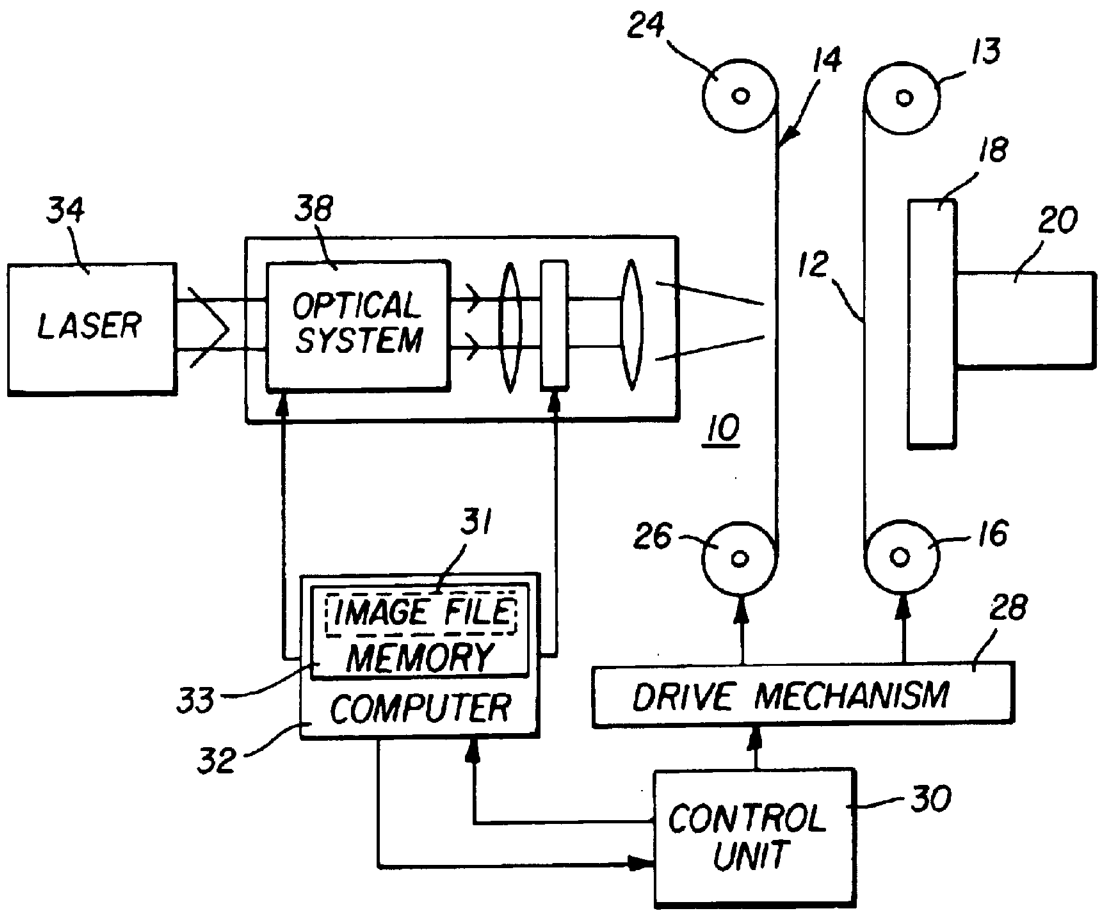
FIG. 1 is a schematic block diagram of a thermal printing apparatus, which makes authenticated images on a receiver to make labels in accordance with the present invention.

Referring to FIG. 1 shows a thermal printer apparatus 10, which employs a receiver 12 and a colorant donor element 14 in the form of a web. Receiver 12 is driven along a path from a supply roller 13 onto a take-up roller 16 by a drive mechanism 28 coupled to the take-up roller 16. The drive mechanism 28 includes a stepper motor, which incrementally advances and stops the receiver 12 relative to the colorant donor clement 14 to a print position. As used herein the term "colorant" can include dyes, pigments or inks, which can be transferred from the colorant donor element 14 to the receiver 12.

Figure 2A:
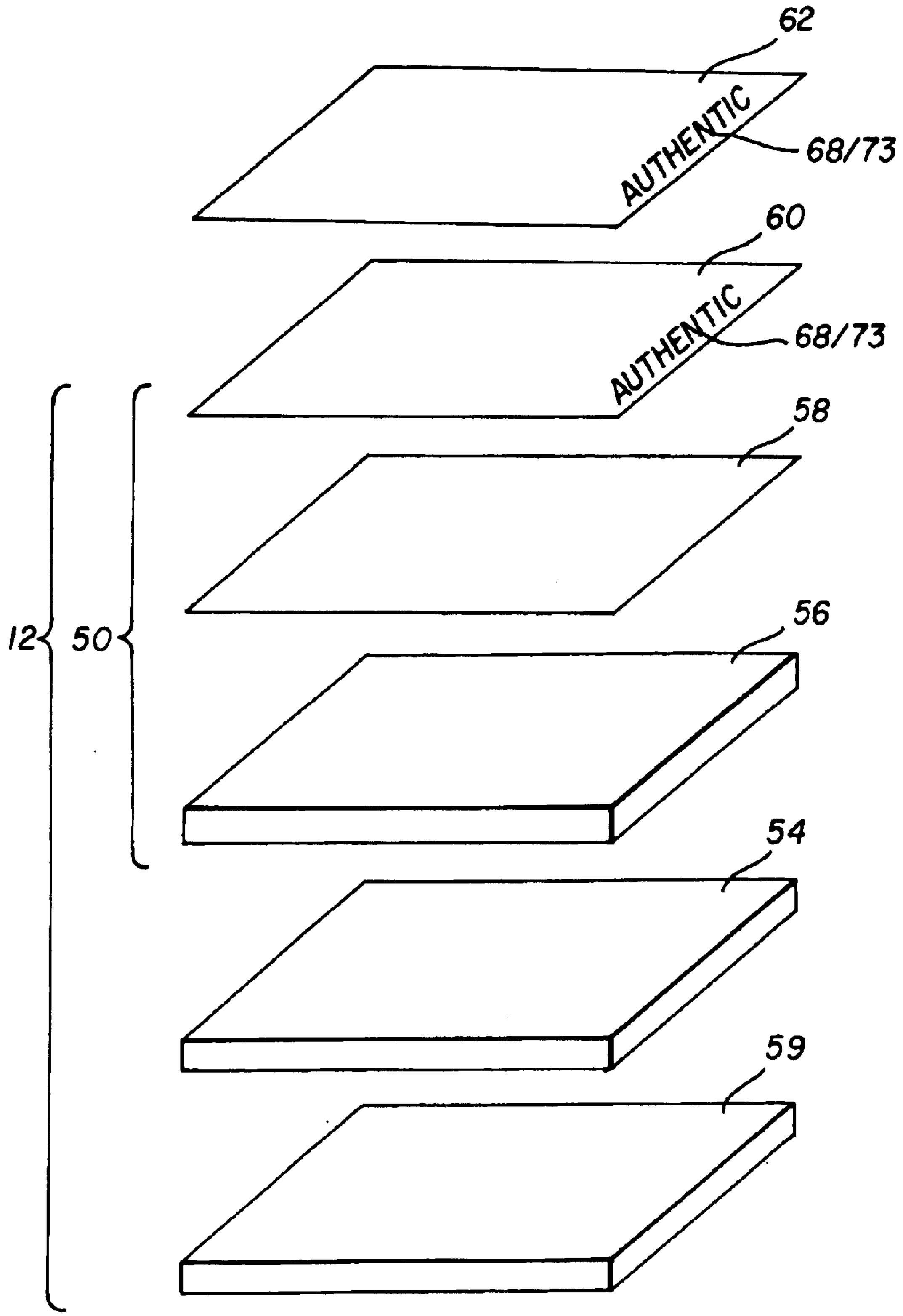
FIG. 2*a* is an exploded cross-sectional view showing various layers in a receiver and protective layer, which has been transferred from a clear coat patch of the colorant donor element to the receiver.

Now referring to FIG. 2*a*, receiver 12 includes an image receiving structure 50, which is formed on a support 56. The support 56 can he formed of paper or plastic such as polyethylene terephthalate or polyethylene naphthalate. It can either be in the form of a web or a single sheet. In this embodiment an adhesive layer 54 provided on the back surface of the support 56. A peelable protective release layer 59 is provided over the adhesive layer 54 until it is to be used for securing the image receiving structure 50 to a surface. This type of construction is particularly suitable when a series of peel-a-part labels 75 (see FIG. 3) are used, e.g. on secure product labels 70 as shown in FIGS. 3 and documents. Now returning to FIG. 2*a*, the image receiving structure 50 includes in sequence three layers, the support 56, a barrier layer 58 and the colorant receiving layer 60. After authentication marks 68 are formed on the colorant receiving layer 60, a protective layer 62, which will be described later, is then formed on the colorant receiving layer 60. Referring now to FIG. 1, in operation, a platen 18 is moved into print position or transferable relationship with the receiver 12 by an actuator 20 pressing the receiver 12 against the colorant donor element 14. Actuators are well known in the field and can be provided by a mechanical linkage, solenoid, and small piston arrangement or the like. Now referring to FIG. 2*b*, the colorant donor element 14 includes a series of colorant patches 64*a*, 64*b*, and 64*c*. These colorant patches 64*a*, 64*b*, and 64*c* can be yellow, cyan and magenta and they are sequentially moved into image transferring relationship with the colorant donor element 14. The result of this process is authenticated images 71 (shown in FIG. 3) formed on the receiver 12.

Now referring to FIG. 1, the colorant donor element 14 is driven along a path from a supply roller 24 onto a take-up roller 26 by a drive mechanism 28 coupled to the take-up roller 26. The drive mechanism 28 includes a stepper motor, which incrementally advances and stops the colorant donor element 14 relative to the receiver 12.

A control unit 30 has a microcomputer converts digital signals corresponding to the desired image 31 from a computer 32 to analog signals and sends them as appropriate to the optical system 38 which modulates the laser beam produced by a laser light source 34 and focuses the laser light onto the colorant donor element 14. The computer 32 includes a memory 33 such as a read only memory that stores different sizes and shapes of labels that can be selected. The laser light source 34 illuminates the colorant donor element 14 and heats such colorant donor element 14 to cause the transfer of colorant to the colorant receiving layer 60 of the image receiving structure 50. This process is repeated until an authenticated image 71 shown in FIG. 3 is formed on each of the image receiving structures 50. Alternatively, a plurality of dye donor resistive elements (not shown) can be in contact with the colorant donor element 14 and can be used to form the authenticated images 71 shown in FIG. 3. When a dye donor resistive element is energized it is heated which causes dye to transfer from the colorant donor element 14 to the receiver 12 in a pattern to provide the colored image. For a more complete description of this type of thermal printing apparatus reference is made to commonly assigned U.S. Pat. No. Re 33,260. Of course the process has to be repeated using the yellow, cyan and magenta patches to complete the colored authenticated image 71 on the secure product label 70 shown in FIG. 3. In accordance with the present invention the authenticated image 71 can have one or more colors.

Figure 2B:
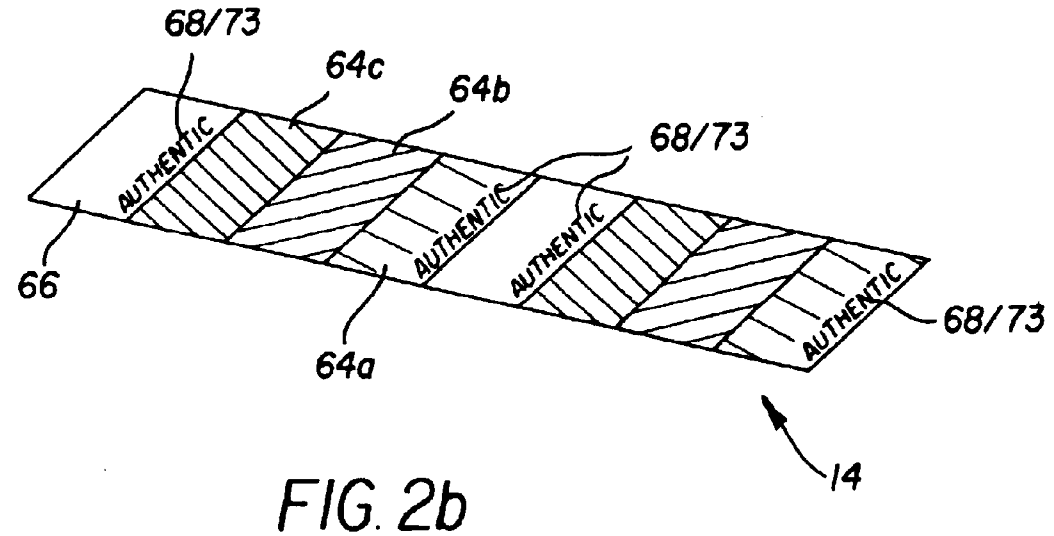
FIG. 2*b* shows a strip of a typical colorant donor element in web format, which can be used by the apparatus shown in FIG. 1.
Figure 3:
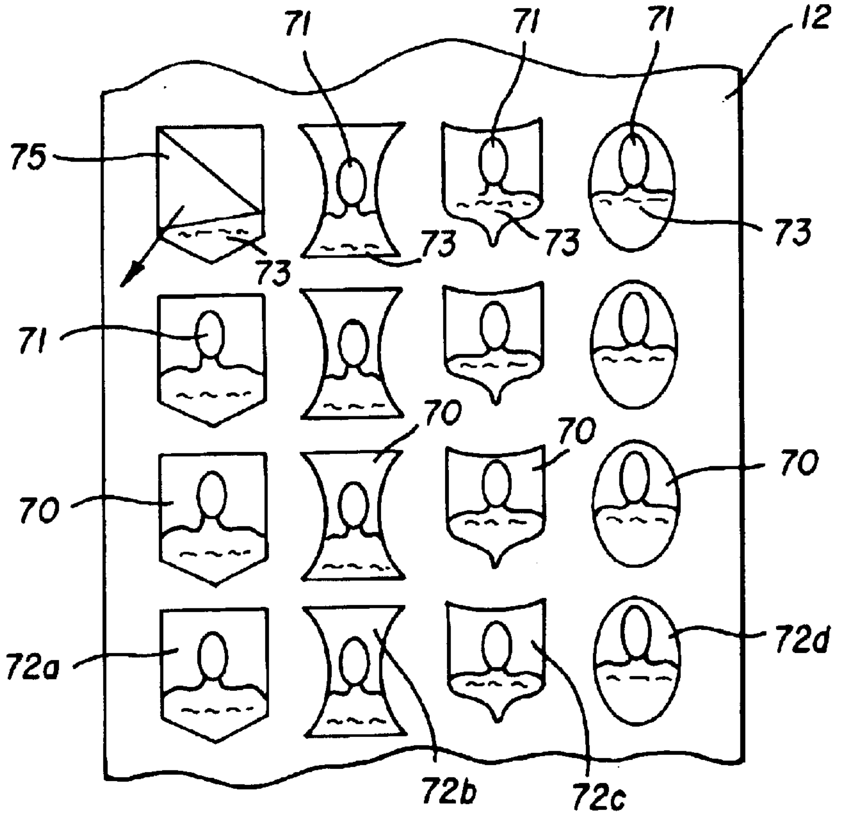
FIG. 3 shows a strip of a typical receiver element with authenticated images in label form printed by the apparatus shown in FIG. 1.

FIG. 2*b* shows a typical section of a strip of a colorant donor, which can be used in the thermal printer apparatus 10 of FIG. 1. The colorant donor element 14, shown in FIG. 1 as a web, includes a series of colorant patches. These colorant patches can be cyan, yellow, and magenta 64*a*, 64*b*, 64*c*, respectively, and they are sequentially moved into image transferring relationship with the colorant donor element 14. Each series of colorant patches 64*a–c* is followed by a protective coating patch 66 which is formed of a material that can form a clear protective layer 62.

Figure 4:
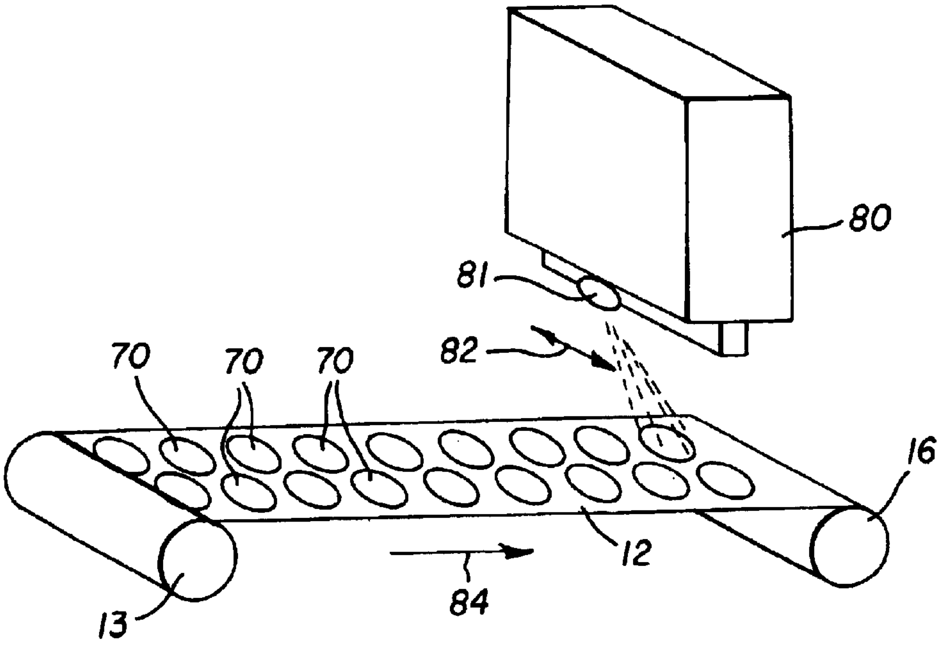
FIG. 4 shows a die cutting apparatus for cutting a completed series of images containing authenticating markings into a pre-specified shape for a product label.

FIG. 4 shows a laser cutting device 80 which uses the digital file stored in the control unit 30 of the thermal printer apparatus 10 to cut out the selected secure product label 70 of different shapes and sizes 72*a*, 72*b*, 72*c*, and 72*d* with the authenticated image 71 both shown in FIG. 3. The laser 81 translates along in the direction of the arrow 82 to cut a selected secure product label 70 from one of the labels 72*a*, 72*b*, 72*c*, and 72*d* as the receiver 12 moves in the direction indicated by the arrow 84.

Figure 5:
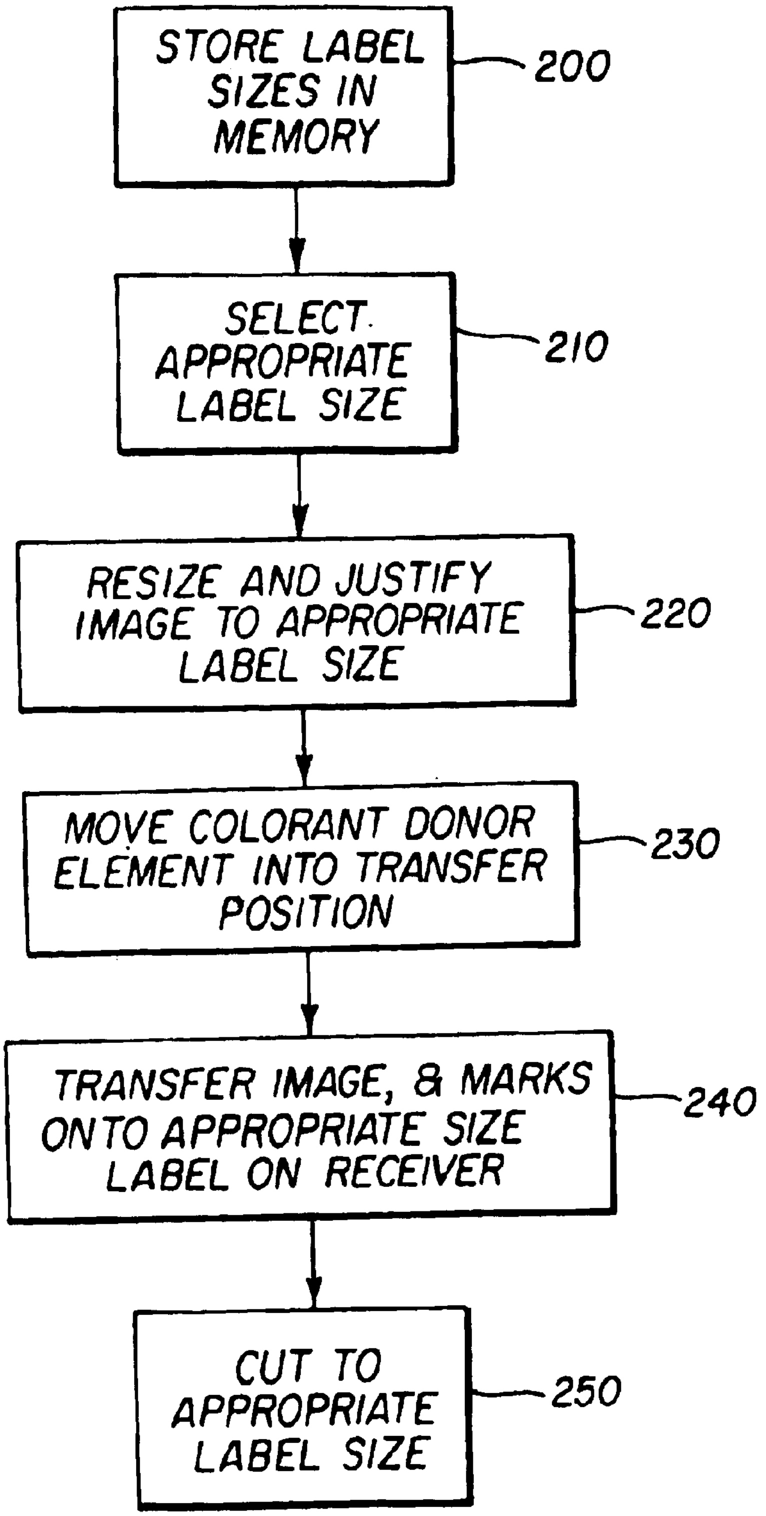
FIG. 5 is a flowchart for the controlling the operation of the computer 32 shown in FIG. 1 to size the images and form such images on a receiver, which is cut by the apparatus shown in FIG. 4 to form labels of a particular size.

Now referring to FIG. 5, the various shapes and sizes of the labels 72*a*, 72*b*, 72*c*, and 72*d* are stored in memory as shown in step 200. Before printing, the appropriate label shape and size is selected from the memory 33 as shown in step 210 and the image 31 stored in memory is resized to justify the image 31 to the size and shape of the selected label shape as shown in step 220. The colorant donor element 14 having a plurality of transferable colorants 14 is moved into transferable relationship with the receiver 12. The colorant donor element 14 includes a representation of the particular authenticated marks 68 which authenticate the particular image having colorant over such representation and marks as shown in step 230. The colorants are transferred onto the receiver 12 in accordance with the representation of the particular image 31 stored in memory and marks 68 in the colorant donor element 14 and the size of the selected label 72*a*, 72*b, c*, and *d* to form authenticated images 71 in the receiver 12 as shown in step 240 and the authenticated images 71 on the receiver 12 are cut as shown in step 250 into the selected shape 72*a*, 72*b*, 72*c*, and 72*d* to form a plurality of peel-a-part labels 75 each having the authenticated image 71.

It is desirable that the authentication marks 68 be highly accurate so that they may not be counterfeited. For that purpose the authentication marks 68 shown in FIG. 2*b* can be created in the protective coating patch 66 containing them by a gravure process. The authentication marks 68 are formed with a high level of detail so that they are difficult to duplicate and permit colorant on the authentication marks 68 to form authenticated images 71. The authentication marks 68 cause an image of the authentication mark 73 shown in FIG. 3 to be formed in the receiver 12. The authentication marks 68 have a high level of detail so that when an authentication mark image 73 is formed it will indicate to a viewer or reader of the receiver 12 that the images are authentic. The gravure process is capable of creating authentication marks 68 of very high resolution, well beyond the capabilities of most common printers. The gravure process is an intaglio process. It uses a depressed or sunken surface for the authentication marks 68. The colorant patches 64*a*, 64*b*, and 64*c* consist of cells or welds etched into a copper cylinder and the unetched surface of the cylinder represents the non-printing areas. The cylinder rotates in a bath of ink. Gravure printing is considered excellent for printing highly detailed authentication marks 68 or pictures. The high expense in making cylinders usually limits gravure printing for long runs. Different types of inks may be used for depositing the authentication marks 68 by the gravure process as noted later.

As is well known in the art, the colorant donor element 14 can be formed in a gravure process. In accordance with the present invention, during the gravure process authentication marks 68 are formed in protective coating patch 66. Alternatively, authentication marks 68 can be formed in one or more of the colorant patches 64*a*, 64*b* and 64*c* of the donor element 14. These authentication marks 68 will embed official information onto an image when colorant is transferred to the receiver 12. These authentication marks 68 provide authenticating information. This authenticating information can be in the form of a bar code, an official seal, alphanumeric data or encoded digitized information. Therefore, during the image forming process the image 31 stored in memory 33 is provided and also the authentication marks 68 are formed on the receiver 12 which permit the image 31 to be authenticated. Alternatively as shown in FIG. 2*a*, the protective layer 62 can be formed on the colorant receiving layer 60 after the image 31 stored in memory has been formed to such colorant receiving layer 60. Authentication marks 68 which authenticate the image 31 after it has been formed can be preformed within the protective layer 62 by a number of well known processes including the thermal printing processes described above. The image 31 stored in memory can be applied to the receiver 12 using the fourth or fifth pass of a thermal printing process. The fourth or fifth pass of the printing process is used to form a transferable protective layer 62 of the receiver 12. For a more complete description of this process, reference is made to commonly assigned U.S. Pat. Nos. 5,387,573 and 5,332,713, which are incorporated herein by reference.

In yet another embodiment of this invention marks authenticating an image can reside in the memory 33 of the computer 32 shown in FIG. 1. It will be understood that these marks representing authenticating mark images 73 are stored in a digital format in firmware, disks or in any other suitable storage device. In this particular embodiment, the computer 32 causes colorants from the colorant patches 64*a*, 64*b* and 64*c* to transfer to the image receiving structure 50 in accordance with the stored digital format (image 31 and marks 68). The firmware can be part of the memory unit 33 of the computer 32. Thereafter the laser light source 34 and optical system 38 heat the transferred colorants in accordance with the image 31 and the authentication marks 68 stored in memory to form the authenticated image 71.

Colorants in the colorant donor element 14 are transferred to the image receiving layer 60 of the receiver 12. A sublimable dye is a suitable colorant that can be effectively transferred to receivers in accordance with the present invention. Examples of sublimable dyes include anthrauinone dyes, e.g. Sumikalon Violet RS.TM. (product of Sumitomo Chemical Co., Ltd.), Dianix Fast Violet 3R-FS.TM. (product of Mitsubishi Chemical Industries, Ltd.), and Kayalon Polyol Brilliant Blue N-BGM.TM. and KST Black 146.TM. (products of Nippon Kayaku Co., Ltd.), azo dyes such as Kayalon Polyol Brilliant Blue BM, Kayalon Polyol Dark blue 2BM.TM., and KST Black KR.TM. (products of Nippon Kayaku Co., Ltd.), Sumickaron Diazo Black 5G product of Sumitomo Chemical Co. Ltd.), and Mkitazol Black 5GH.TM. (product of Mitsui Toatsu Chemicals, Inc.); direct dyes such as Direct Dark Green B.TM. (product of Mitsubishi Chemical Industries, Ltd.) and Direct Brown M.TM. and Direct Fast Black D.TM. (products of Nippon Kayaku Co., Ltd.); acid dyes such as Kayanol Milling Cyanine 5R.TM. (product of Nippon Kayaku Co., Ltd.); basic dyes such as Sumicacryl Blue 6G.TM. (product of Sumitomo Chemical Co., Ltd.), and Aizen Malachite Green.TM. (product of Hodogaya Chemical Co., Ltd.); or any of the dyes disclosed in U.S. Pat. No. 4,541,830. The above dyes may be employed singly to obtain a monochrome. The dyes may be used at a coverage of from about 0.05 to about 1 g/m2 and are preferably hydrophobic.

When the colorants are inks or dyes, they can be of the type that fluoresce and are not necessarily visible to the unaided eye as described in commonly-assigned U.S. Pat. Nos. 5,752,152; 5,919,730; 5,772,250; 5,864,742; 6,001,516; and 5,768,874, the teachings of which are incorporated by reference. These inks or dyes can reside on a patch of a colorant donor element 14 and be applied during additional passes.

Figure 2C:
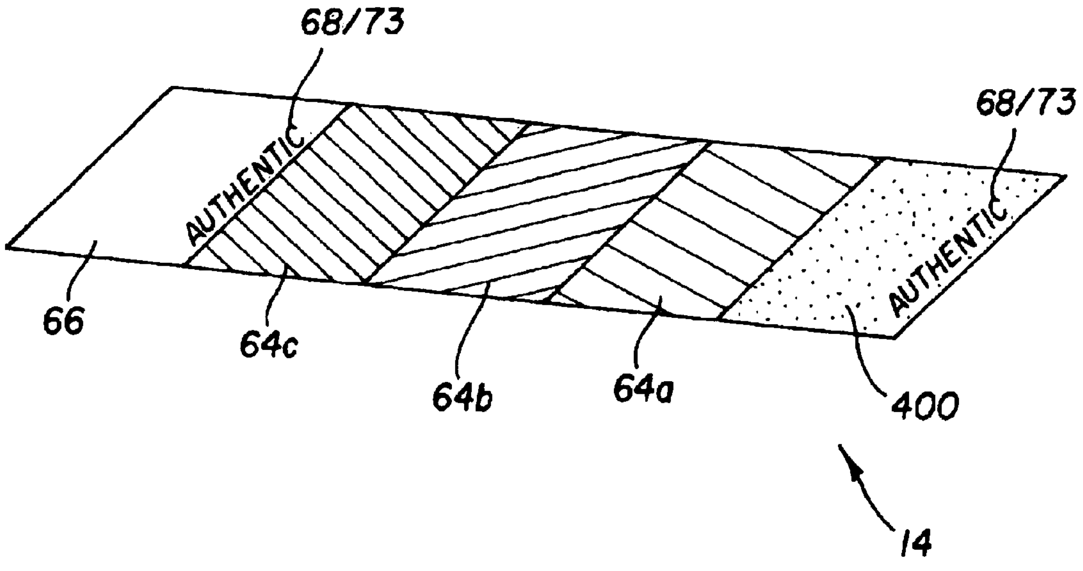
FIG. 2*c* shows another embodiment of the strip of colorant donor element shown in FIG. 2*b;*

Turning now to FIG. 2*c* which show a strip of a typical colorant donor element 14 in web format with the addition of patch 400 containing thermally transferable UV and IR dies selected from a list disclosed U.S Pat. No. 5,006,503 entitled "Thermally-transferable fluorescent europium complexes" by Byers et al the teachings of which are incorporated by reference. The above fluorescent europium complexes are essentially invisible, but emit with a unique red hue in the region of 610 to 625 nm when irradiated with 360 nm ultraviolet light. This red hue is highly desirable for security-badging applications. Europium(III) is the only rare-earth known to be suitable for the practice of the invention. Rare earth metals, including europium, are described in the literature such as S, Nakamura and N. Suzuki, Polyhedron, 5, 1805 (1986); T. Taketatsu, Talanta, 29, 397 (1982); and H. Brittain, J. C. S. Dalton, 1187 (1979). These inks or dyes can reside on a patch 400 of a colorant donor element 14 and be applied during additional passes by the apparatus shown in FIG. 1

Turning again to FIGS. 2*a* and 3, which shows the structure of the receiver 12 and the output of the printing process, which is a series of viewable authenticated images 71 such as secure product labels 70 and documents respectively. The printer apparatus 10 of FIG. 1 can produce the series of secure product labels 70 in the receiver 12 using one or more passes. When multiple colors are to be applied then, for example, if cyan, magenta, yellow and black are the colorant patches then there has to be four passes by the receiver 12. For another example, if cyan, magenta and yellow series of images are formed, another pass can take place, which causes the protective layer 62 to be formed on the receiver 12. A series of authentication marks 68 were formed in the protective coating patch 66 which are authenticating mark images 73 (a series of images formed on the receiver 12). The authenticating mark images 73are shown in FIGS. 2*a*, 2*b*, 2*c* and 3. Turning briefly to FIGS. 2*b* and 2*c*, where there are three colorant patches cyan 64*a*, yellow 64*b* and magenta 64*c* and the protective layer 62and in another embodiment three colorant patches cyan 64*a*, yellow 64*b* and magenta 64*c*, patch 400 containing thermally transferable UV and IR dies and the protective layer 62. Authentication marks 68 are provided in the protective coating patch 66 and which have authentication marks 68 applied over them. The authenticated images 71 when formed with their adhesive layer 54 of FIG. 3 are easily peeled free of the protective release layer 59. Such a structure is suitable for secure product labels 70 and documents as shown in FIG. 3.

Figure 6:
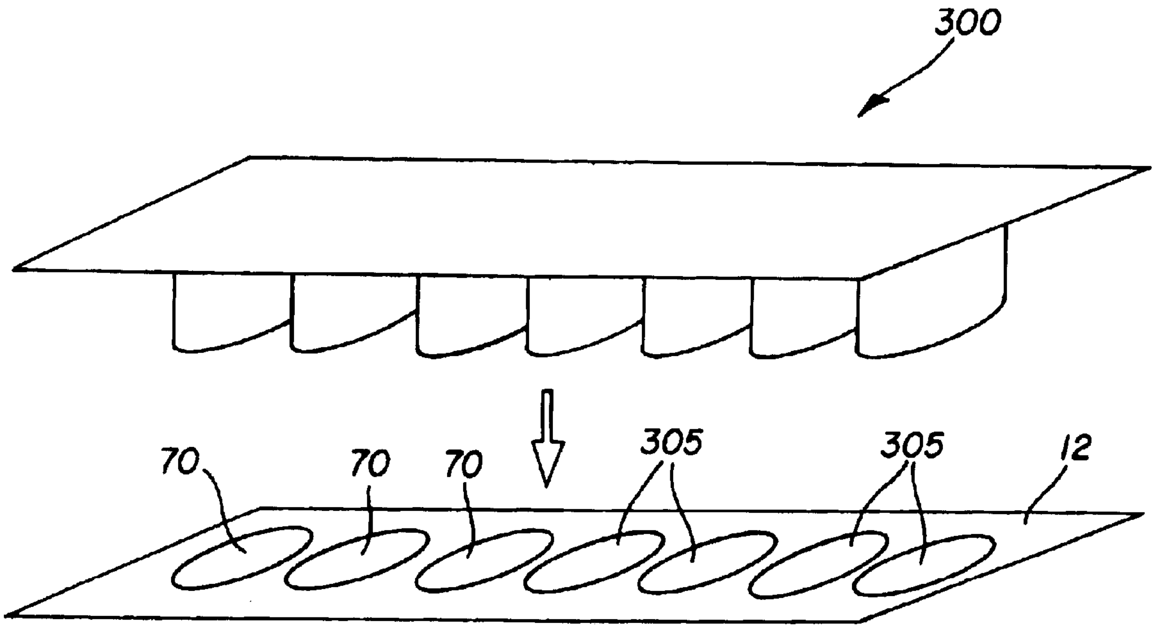
FIG. 6 illustrates a die cutting apparatus for cutting a completed series of authenticated images into a pre-specified shape for a product label.

Turning now to FIG. 6, which shows a die cutting apparatus 300 for cutting a completed series of secure product labels 70 containing authenticated images 71 into a pre-specified shape 305 for the secure product labels 70.

While the invention has been described with reference to the embodiment disclosed, it is not confined to the details set forth, but is intended to cover such modifications or changes as may come within the scope of the following claims.

Parts List

10 printer apparatus
12 receiver
13 supply roller
14 colorant donor element
16 take-up roller
18 platen
20 actuator
24 supply roller
26 take-up roller
28 drive mechanism
30 control unit
31 image
32 computer
33 memory
34 laser light source
38 optical system
50 image receiving structure
54 adhesive layer
56 support
58 barrier layer
59 protective release layer
60 colorant receiving layer
62 protective layer
64*a* colorant patch
64*b* colorant patch
64*c* colorant patch
66 protective coating patch (invisible dye donor patch)
68 authentication marks
70 secure product labels
71 authenticated image Parts List Cont'd

72*a* label shapes
72*b* label shapes
72*c* label shapes
72*d* label shapes
73 image of authentication mark
75 peel-a-part labels
80 laser cutting device
81 laser
82 arrow
84 arrow
200 step
210 step
220 step
230 step
240 step
250 step
300 die cutting apparatus
305 pre-specified product label shape
400 patch

What is claimed is:

1. A method of forming authenticated secure images on labels comprising the steps of:

(a) storing in memory a number of different selectable label sizes and shapes;

(b) selecting an appropriate label size and shape from the memory for a particular image;

(c) moving a colorant donor element having a colorant into transferable relationship with a receiver, the colorant donor element includes marks which authenticate a particular image and having colorant over such marks;

(d) transferring colorant onto the receiver in accordance with the representation of the particular image and marks in the colorant donor element and the size and shape of the selected label to form authenticated images in the receiver; and (e) cutting the images on the receiver into the selected shape to form a plurality of labels each having an authenticated image.

2. The method of claim 1 wherein the marks are covered with a colorant of at least one color.

3. The method of claim 1 wherein there are a plurality of colorants that form the authenticated image, the colorants being dye and the dyes being transferred in response to heat.

4. The method of claim 3 wherein the colorants that form the authenticated image include cyan, magenta and yellow which are sequentially transferred to form continuous tone color images.

5. The method of claim 1 wherein the marks are formed by a gravure process so that the marks provide a high level of detail which is difficult to duplicate.

6. The method according to claim 1 wherein the marks are invisible to the unaided eye.

7. The method according to claim 3 wherein the dyes are selected from fluorescent europium complexes suitable for thermal transfer.

8. The method of claim 1 wherein the receiver has first and second surfaces wherein the first surface is a colorant receiving surface and the second surface has an adhesive.

9. A method of forming authenticated secure images on image areas on labels comprising the steps of:

(a) storing in memory a number of different selectable label size and shapes;

(b) selecting an appropriate label size and shapes from the memory for a particular image;

(c) moving a colorant donor element having a colorant into transferable relationship with a receiver, the colorant donor element includes marks which authenticate a particular image and having colorant over such marks;

(d) adjusting the size of the particular image to be consistent with the size of the label;

(e) transferring colorant onto the receiver in accordance with the representation of the particular image and marks in the colorant donor element and the size and shapes of the selected label to form authenticated images in the receiver; and (f) cutting the images on the receiver into the selected shape to form a plurality of labels each having an authenticated image.

10. The method of claim 9 wherein the size adjusting step includes sizing the image so that it forms a justified image on the label.

* * * * *